(12) United States Patent
Elsharawy

(10) Patent No.: US 7,199,443 B2
(45) Date of Patent: Apr. 3, 2007

(54) INTEGRATION OF FILTERS USING ON-CHIP TRANSFORMERS FOR RF AND WIRELESS APPLICATIONS

(75) Inventor: Badawy Elsharawy, Mesa, AZ (US)

(73) Assignee: Arizona Board of Regents, Acting on behalf of Arizona State University, Tempe, AZ (US)

( * ) Notice: Subject to any disclaimer, the term of this patent is extended or adjusted under 35 U.S.C. 154(b) by 107 days.

(21) Appl. No.: 10/505,258

(22) PCT Filed: Feb. 21, 2003

(86) PCT No.: PCT/US03/05133

§ 371 (c)(1),
(2), (4) Date: Aug. 19, 2004

(87) PCT Pub. No.: WO03/073550

PCT Pub. Date: Sep. 4, 2003

(65) Prior Publication Data

US 2005/0095791 A1     May 5, 2005

Related U.S. Application Data

(60) Provisional application No. 60/358,898, filed on Feb. 22, 2002.

(51) Int. Cl.
*H01L 29/00* (2006.01)
(52) U.S. Cl. ............... 257/528; 257/532; 257/E27.017; 257/E27.024
(58) Field of Classification Search ................ 257/528, 257/532, E27.001, E27.017, E27.024; 438/381; 455/73, 80, 280, 272
See application file for complete search history.

(56) References Cited

U.S. PATENT DOCUMENTS

| 5,949,299 A | 9/1999 | Harada |
| 6,014,386 A | 1/2000 | Abraham |
| 6,045,893 A | 4/2000 | Fukushima et al. |
| 6,850,746 B1 * | 2/2005 | Lloyd et al. ................. 455/272 |

OTHER PUBLICATIONS

International Search Report for International Application No. PCT/US2003/005133, filed Feb. 21, 2003, International Search Report dated May 19, 2003 and mailed Aug. 1, 2003 (3 pgs.).
International Preliminary Examination Report for International Application No. PCT/US2003/005133, filed Feb. 21, 2003, International Preliminary Examination Report mailed Dec. 24, 2003 (4 pgs.).

* cited by examiner

*Primary Examiner*—Hsien-Ming Lee
(74) *Attorney, Agent, or Firm*—McDonnell Boehnen Hulbert & Berghoff LLP

(57) ABSTRACT

A band pass filter (114) is formed on an integrated circuit (IC) chip (102). Such band pass filter (114) may be used in a RF or wireless communication device, such as a mobile phone or a personal data assistant (PDA). The band pass filter (114) includes a transformer (202 and 204) made of a pair of metallic spirals formed on the IC chip. The metallic spirals may have substantially square or rectangular overall shape, and may be fabricated using copper. The metallic spirals may be co-planar and inter-wound or may be stacked, one on top of the other, and separated by a dielectric layer. The transformer (202 and 204) is capable of receiving an input signal, and providing high pass filtering to the input signal. The band pass filter (114) also includes a capacitor (226, 2; 230 and 232) that is capable of receiving the input signal and providing low pass filtering in conjunction with an inductance of the transformer (202 and 204). The band pass filter (114) provides band pass filtering through cascading said high pass and low p filtering.

21 Claims, 9 Drawing Sheets

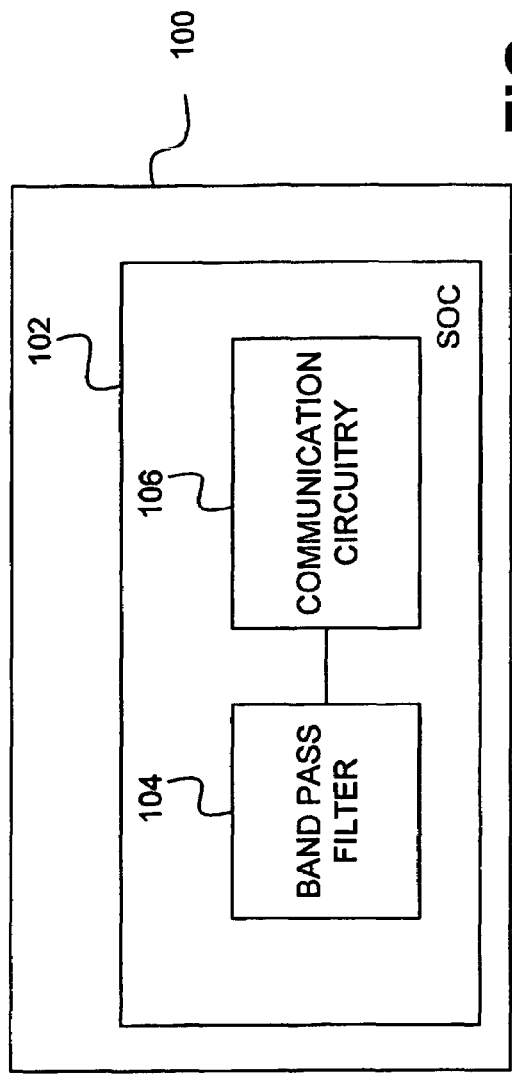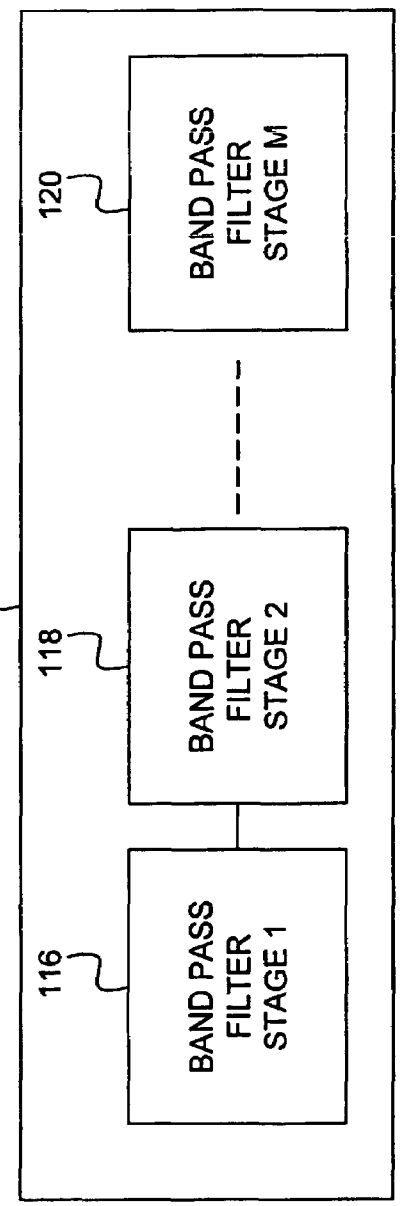

US 7,199,443 B2

INTEGRATION OF FILTERS USING ON-CHIP TRANSFORMERS FOR RF AND WIRELESS APPLICATIONS

CROSS-REFERENCE TO RELATED APPLICATION

This application claims the benefit of U.S. Provisional Patent Application No. 60/358,898, filed Feb. 22, 2002.

BACKGROUND

The present application relates generally to communication systems, and more particularly to fabrication of integrated circuit (IC) chips having on-chip transformer-based filters for RF and wireless applications.

Passive filters are typically employed in high frequency (e.g., microwave) communication devices. For example, applications such as high linearity differential amplifiers for CDM (code division multiplexing) and balanced mixers typically require passive filters. These passive filters commonly include coupled line filters. In planar types of coupled line filters, parallel λ/4 transmission lines are often used to provide a transformer function. Due to the length and size of these transmission lines, the coupled line filters are typically fabricated off of integrated circuit (IC) chips in the communication devices.

Integration of filters and other passive elements into communication ICs is often desirable because such integration typically results in reduction of cost and size of communication devices. Therefore, it is desirable to fabricate a passive filter that is suitable for integration on a communication IC chip.

SUMMARY

An exemplary aspect of the present invention provides a band pass filter formed on an integrated circuit (IC) chip. The band pass filter comprising: a transformer capable of receiving an input signal and providing high pass filtering, said transformer comprising at least a pair of metallic spirals formed on the IC chip; and a capacitor capable of receiving said input signal and providing low pass filtering in conjunction with an inductance of the transformer, wherein said band pass filter provides band pass filtering through cascading said high pass and low pass filtering.

Another exemplary aspect of the present invention provides a communication system-on-chip (SOC). The SOC comprising: communication circuitry and a band pass filter formed on an integrated circuit (IC) chip, said band pass filter comprising a transformer capable of receiving an input signal and providing high pass filtering, said transformer comprising at least a pair of metallic spirals formed on the IC chip; and a capacitor capable of receiving said input signal and providing low pass filtering in conjunction with an inductance of the transformer, wherein said band pass filter provides band pass filtering through cascading said high pass and low pass filtering.

Yet another exemplary aspect of the present invention provides a communication device. The communication device comprising: a communication system-on-chip (SOC) comprising communication circuitry and a band pass filter formed on an integrated circuit (IC) chip, said band pass filter comprising a transformer capable of receiving an input signal and providing high pass filtering, said transformer comprising at least a pair of metallic spirals formed on the IC chip; and a capacitor capable of receiving said input signal and providing low pass filtering in conjunction with an inductance of the transformer, wherein said band pass filter provides band pass filtering through cascading said high pass and low pass filtering.

These and other aspects of the invention will be more readily comprehended in view of the discussion herein and accompanying drawings.

BRIEF DESCRIPTION OF THE DRAWINGS

FIG. 1 is a block diagram of a communication device that includes an on-chip band pass filter in an exemplary embodiment in accordance with aspects of the present invention;

FIG. 2 is a block diagram of a band pass filter that includes multiple stages that are cascaded to provide enhanced filter performance;

DETAILED DESCRIPTION

In an exemplary embodiment in accordance with aspects of the present invention, a filter that is suitable for integration on a semiconductor substrate to realize enhanced device characteristics is provided. The exemplary on-chip filter generally results in significant size and cost advantages compared to existing off-chip alternatives. Hence, the exemplary on-chip filter is useful to the wireless industry in developing and manufacturing next generation of low cost advanced communication devices.

FIG. 1 is a block diagram of a communication device 100 in an exemplary embodiment in accordance with aspects of the present invention. In one embodiment, the communication device 100 is a portable/hand-held communication device such as a mobile/cellular phone or a PDA (personal data assistant). In other embodiments, the communication device 100 is a land, air or space-based communication platform.

The communication device 100 includes a communication IC 102. In some embodiments, the communication IC is a communication system-on-chip (SOC). The communication IC 102 has integrated thereon a band pass filter 104 and communication circuitry 106. The communication IC 102 of FIG. 1 is shown for illustrative purposes only; in practice, the communication IC 102 would contain other components (active and/or passive) integrated thereon. Further, the filter in other embodiments may be low pass and/or high pass filters.

The communication circuitry 106, for example, may operate at radio frequency and/or microwave frequency, and may be referred to, respectively, as a radio frequency integrated circuit (RFIC) and a monolithic microwave integrated circuit (MMIC). The IC substrate may be standard silicon because it can be more economical to use silicon than other substrates (e.g., GaAs (gallium arsenide)) due to the low cost of silicon. However, GaAs or any other suitable semiconductor substrate may be used in other embodiments.

FIG. 2 is a block diagram of a band pass filter 114, which may be applied as the band pass filter 104 of FIG. 1. The band pass filter 114 is used to pass only those signals that fall within the band of frequencies (e.g., between 1 giga Hertz (GHz) and 2.5 GHz) that meet its design. The band pass filter 114, for example, includes multiple band pass filter stages (segments) 1 (116) and 2 (118) through M (120). The number of band pass filters stages in series can be as few as two and can be more than three (e.g., a dozen).

Figure 3:
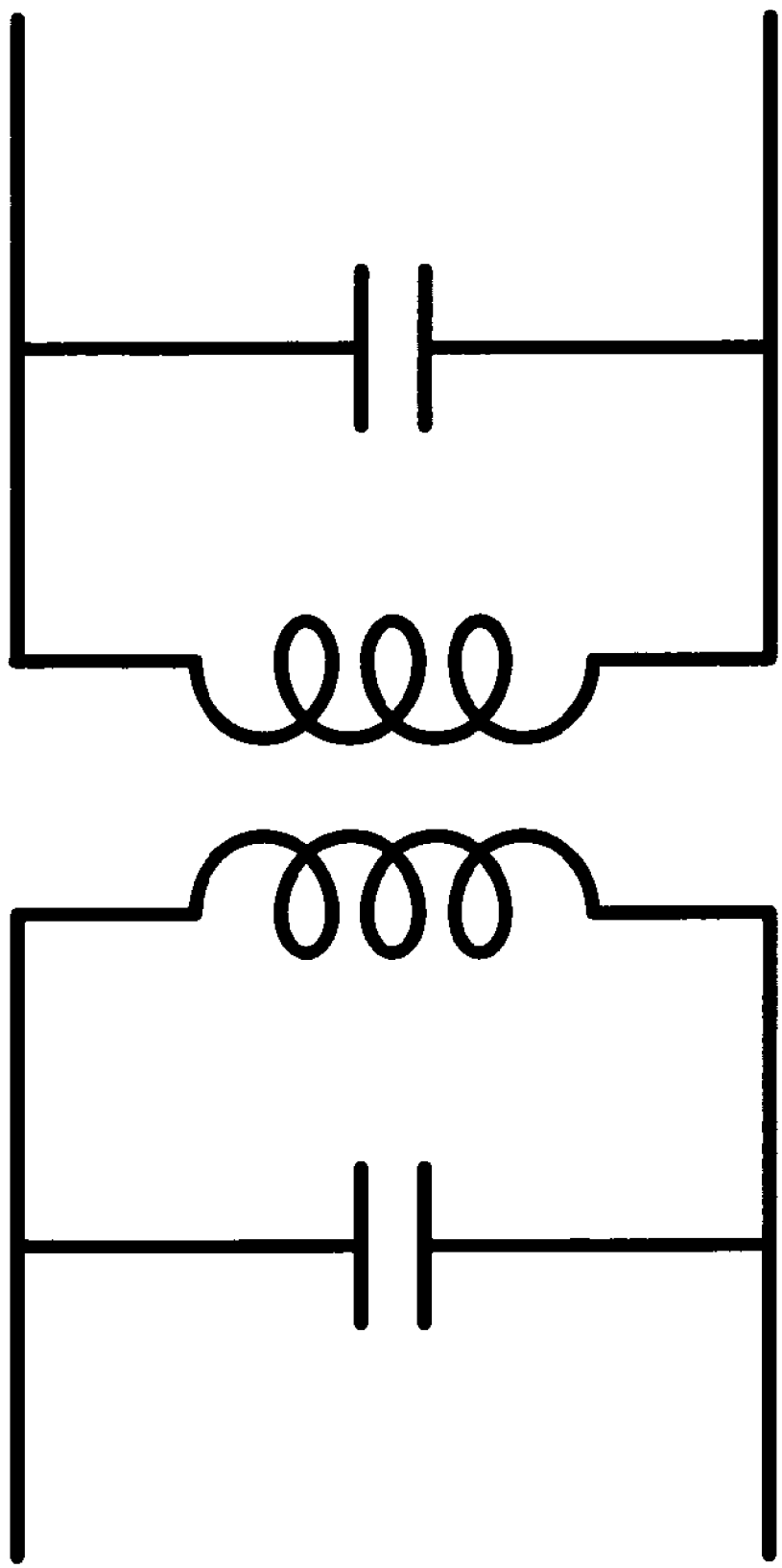
FIG. 3 is a schematic diagram of a single-stage band pass filter in an exemplary embodiment in accordance with aspects of the present invention.

FIG. 3 is a schematic diagram of a band pass filter 200 that can be implemented on-chip in an exemplary embodiment in accordance with the present invention. For example, the band pass filter 200 may be applied as the band pass filter 104 of FIG. 1 or the band pass filter stage 116, 118 or 120 of FIG. 2. The band pass filter 200 includes a transformer that includes inductors 202 and 204. The band pass filter 200 also includes capacitors 206 and 208 coupled across inductors 202 and 204, respectively. Hence, the capacitors 206 and 208 may be referred to as shunt capacitors. In the exemplary embodiment, a transformation ratio of the transformer may be between approximately 1:1 to approximately 1:2. The transformers in other embodiments may have different transformation ratios.

Since transformers have high frequency filtering characteristics, the inductors 202 and 204 provide high pass filtering of the band pass filter 200. Further, the external capacitors 206 and 208 as well as the inductance (inherent to the windings) of the inductors 202 and 204 provide low pass filtering. Hence, the band pass filter 200 has band pass filtering characteristics realized through a cascade of low and high pass filters.

The band pass filter 200, for example, may be considered to include a J-inverter with specific value of J chosen to yield a specified performance. A J inverter by itself may be equivalent to an ideal transformer connected to a transmission line. For example, −90 degree J inverter is equivalent to an ideal transformer with N=J and a delay=−90 degrees. One advantage of on-chip transformers is that they include both the transformation and the delay required for the design of J-inverter. In the band pass filter 200, the capacitors 206 and 208 are used to increase the delay to the desired level, i.e., −90 degrees.

It should be noted that, when the band pass filter 200 is used as one of the band pass filter stages in FIG. 2, the filter stages except for the first one may have only one capacitor so that there is only one of either capacitor 206 or 208 between any two adjacent transformers, and the number of capacitors in the cascaded band pass filter is one plus the number of transformers. Alternatively, the capacitance of the capacitors between two adjacent band pass filter stages may be reduced to provide same effect as removing one capacitor since the capacitance of parallel capacitors adds.

Figure 4:
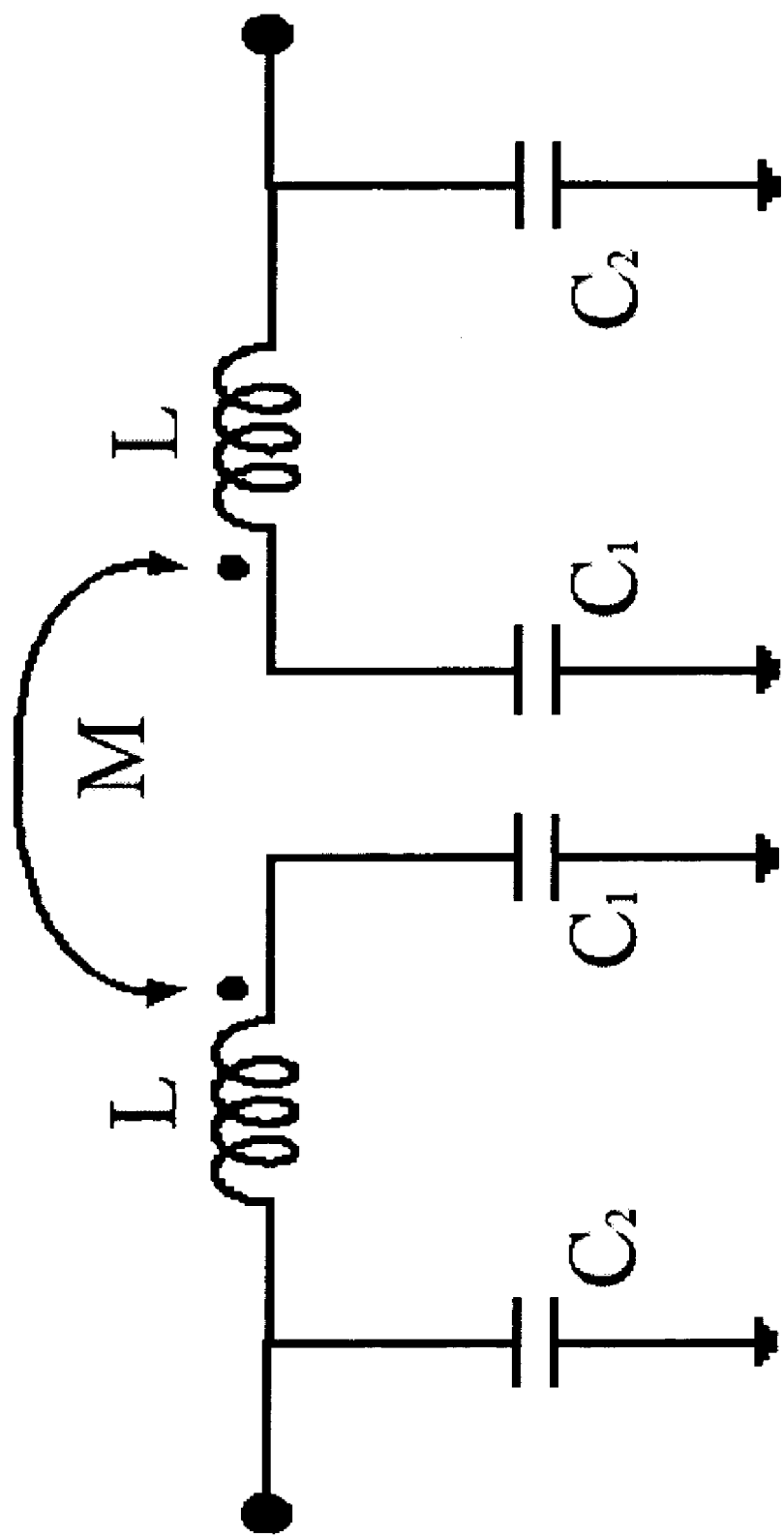
FIG. 4 is a schematic diagram of a single-stage band pass filter in another exemplary embodiment in accordance with aspects of the present invention.

FIG. 4 is a schematic diagram of a band pass filter 220 having a topology different from that of the band pass filter 200. The band pass filter 220 may also be applied as the band pass filter 104 of FIG. 1 or the band pass filter stages 116, 118 or 120 of FIG. 2. The band pass filter 220 includes inductors 222 and 224 that operate together as a transformer. The band pass filter 220 also includes capacitors 226, 228, 230 and 232, which are coupled, respectively, between a first end of the inductor 222 and ground, between a second end of the inductor 222 and ground, a first end of the inductor 224 and ground, and a second end of the inductor 224 and ground. An input may be applied at the first end of the inductor 224, and an output may be taken at the second end of the inductor 224.

In an exemplary embodiment, the capacitors 226 and 232 have substantially the same capacitance, and the capacitors 228 and 230 have substantially the same capacitance. Further, the capacitance of the capacitors 228 and 230 may be substantially less than the capacitance of the capacitors 226 and 232. In an exemplary implementation, the capacitance of the capacitors 228 and 230 is 0.7 pF (pico farad), and the capacitance of the capacitors 226 and 232 is 2.2 pF. Further, the inductance of the inductors 22 and 224 in the exemplary embodiment is 4.3 nano henry (nH).

For example, the capacitors 228 and 230 should be selected to allow maximum RF current to flow inside the transformer to give maximum coupling and minimum insertion loss at the operation frequency. Further, the capacitors 226 and 232 should be selected to obtain good rejection at high frequencies.

Figure 5:
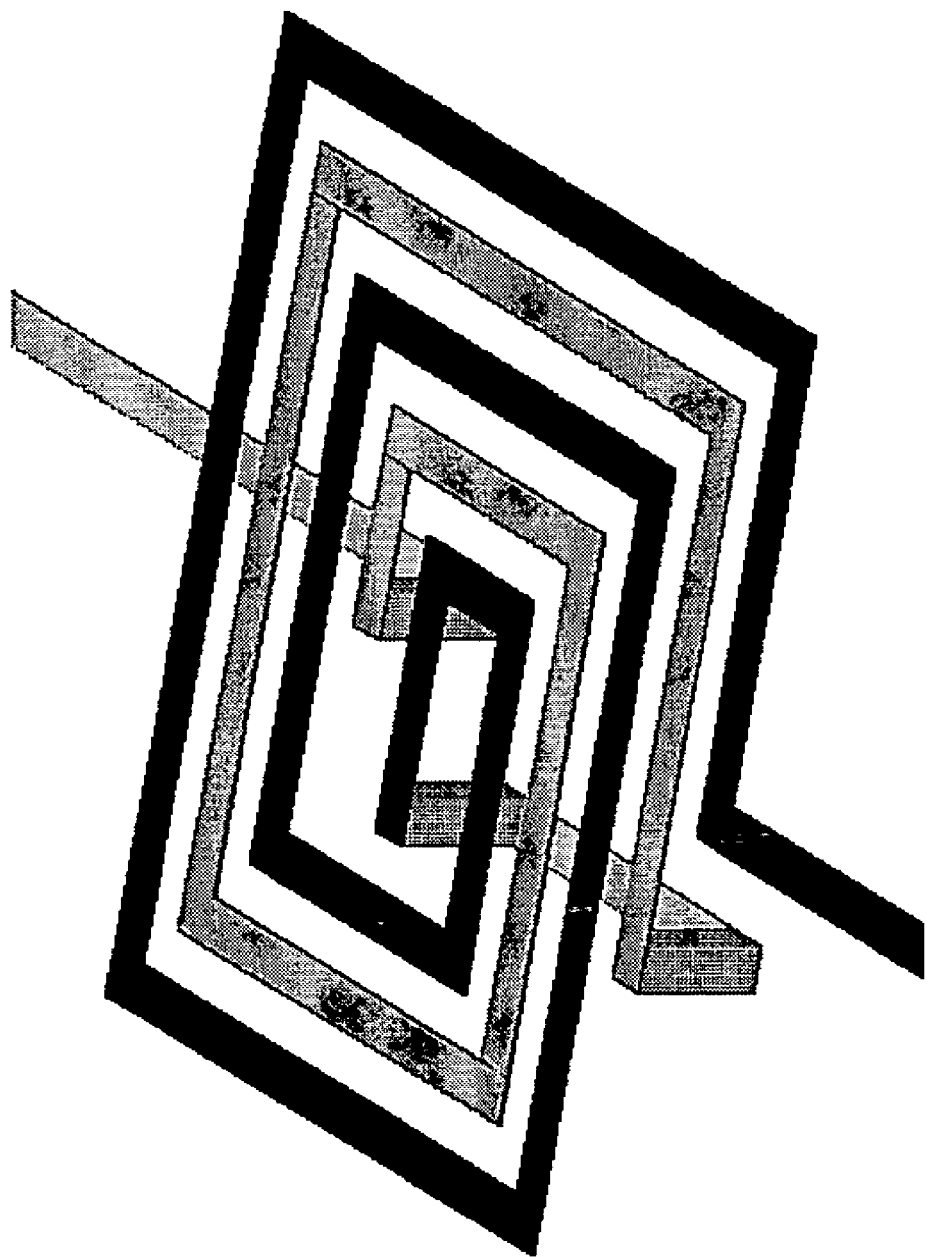
FIG. 5 is an on-chip transformer used to fabricate a band pass filter in an exemplary embodiment in accordance with aspects of the present invention.

In an exemplary embodiment according to the present invention, an on-chip transformer (balun) based band pass filter is fabricated, in which the on-chip transformer is formed using metallic spirals to minimize device size. FIG. 5, for example, illustrates an on-chip transformer 300. As can bee seen in FIG. 5, the transformer 300 includes co-planar (i.e. on the same plane or layer) metallic spirals ("windings") 302 and 304. The co-planar spirals 302 and 304 may be referred to as inter-wound or interleaved spirals. The transformation ratio of the transformer 300 may be between approximately 1:1 to approximately 1:2, for example.

Figure 6:
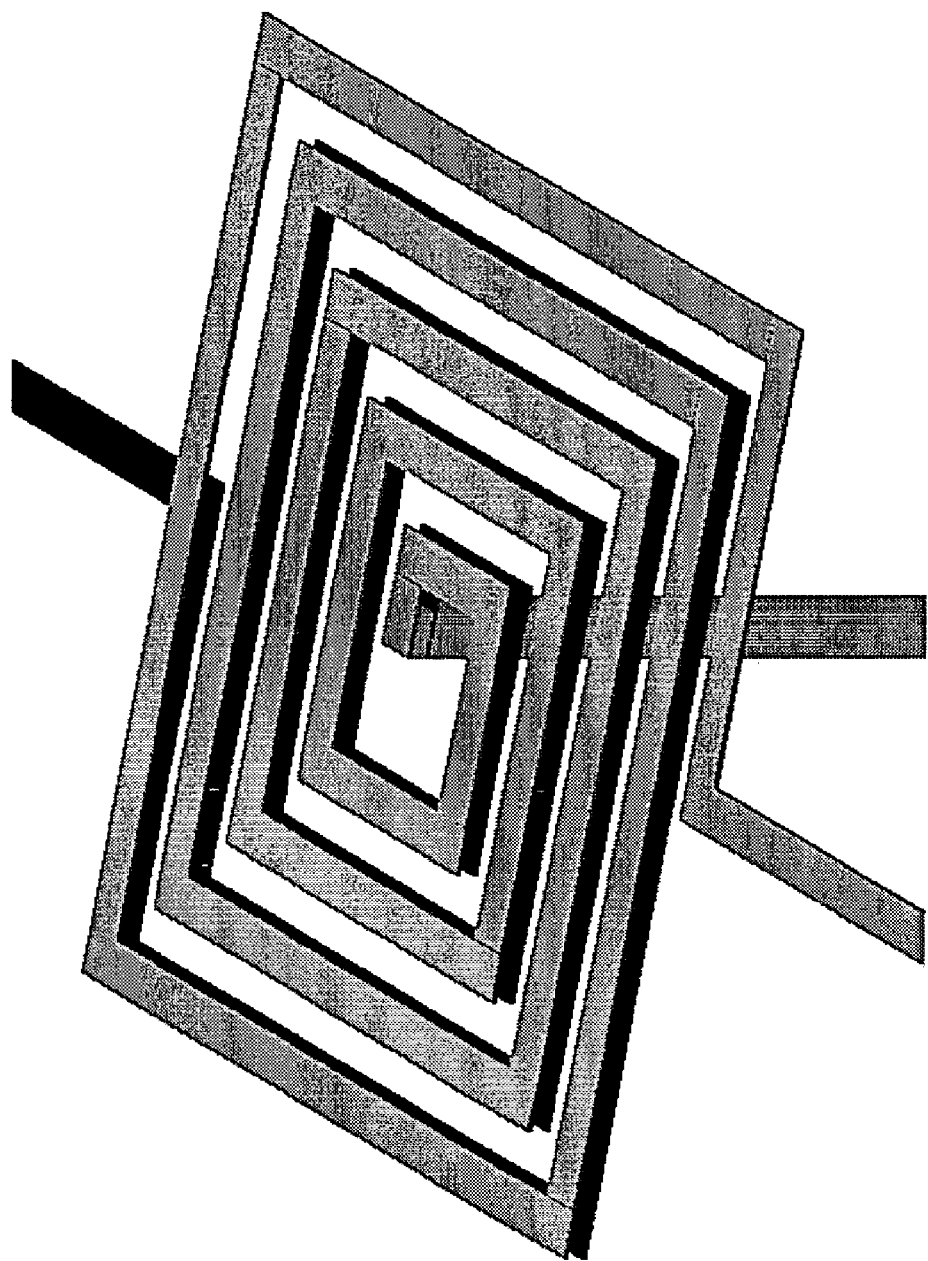
FIG. 6 is an on-chip transformer used to fabricate a band pass filter in another exemplary embodiment in accordance with aspects of the present invention.
Figure 7:
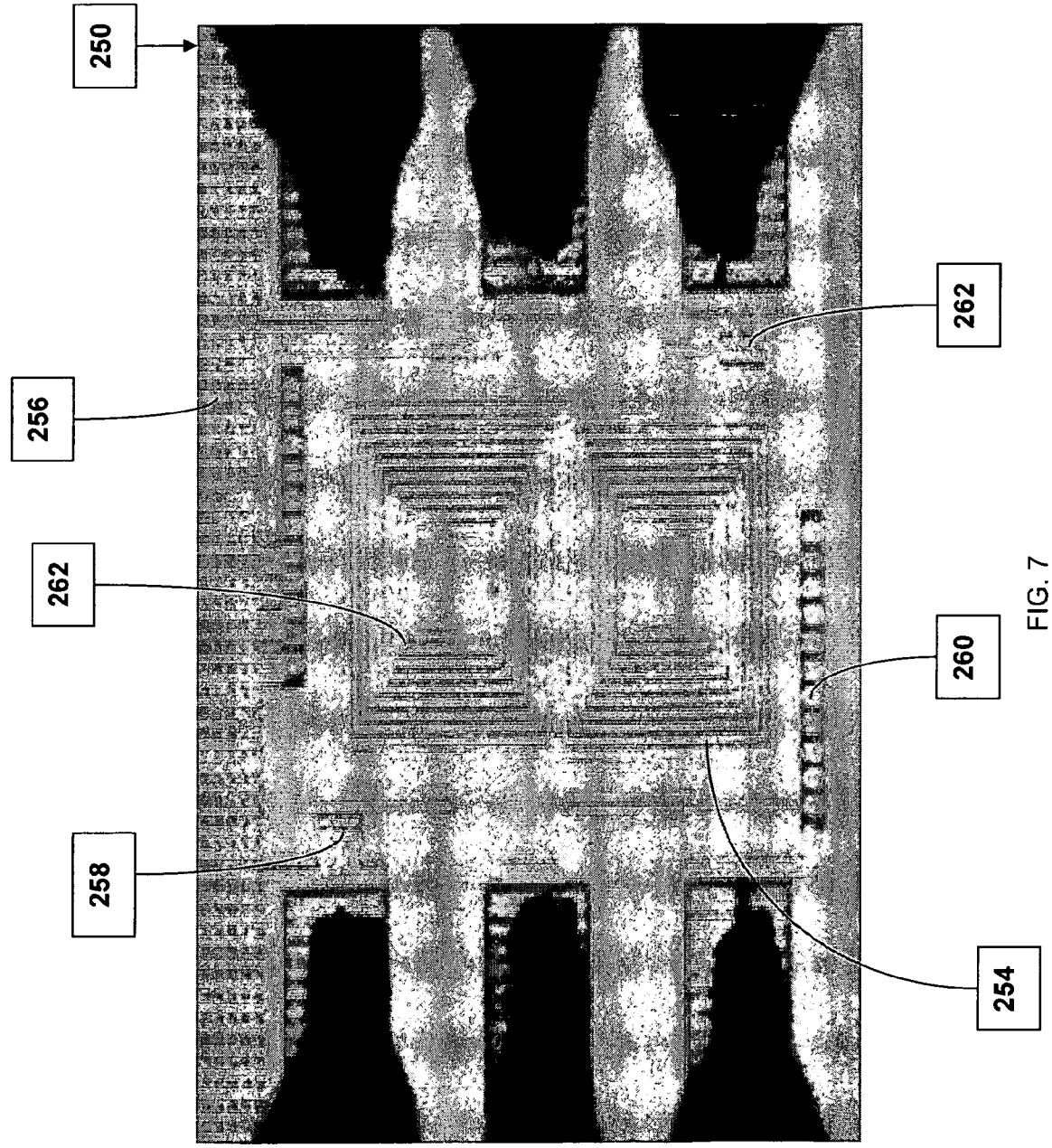
FIG. 7 is a photo image of an on-chip filter having a topology of the exemplary band pass filter of FIG. 4.

As illustrated on FIGS. 5–7, the metallic spirals in this and other embodiments may have a substantially rectangular or square overall shape where a continuous metallic strip turns at substantially 90 degree angles with its straight length decreasing after each turn as the strip approaches a center of the spiral. In other embodiments, the metallic spirals may have other overall shapes, such as a substantially circular overall shape, or the like.

As filter integration using on-chip inductor/capacitor is expected to have a quality factor ("Q") that is limited by the quality factor of inductors included in the filter, it is desirable to use inductors with high quality factors to realize a high Q filters and good high frequency performance. In an exemplary embodiment according to the present invention, a stacked transformer 310 as shown on FIG. 6 is provided. The stacked transformer 310 includes two layers of spirals ("windings") 312 and 314, where the winding 312 is underneath the winding 314. The stacked transformer 310 may offer a better coupling and substantially higher transformation ratio than the inter-wound transformers.

The width of metal and slot width of the top spiral may be decreased to increase the number of turns while occupying the same areas as the bottom spiral. The top and bottom spirals may be separated by a layer of dielectric such as silicon oxide or the like. The transformation ratio of the transformer 310 may be between approximately 1:1 to approximately 1:2, for example. High Q may also be maintained by using copper as the metal for fabricating the spirals. Use of copper spirals, for example, typically have better Q characteristics over using aluminum spirals as in conventional designs.

The low ohmic resistance of the copper may compensate for the reduced strip width and higher number of turns of the top spiral. Using copper, filter insertion loss may be reduced and high Q characteristics may be realized. Any suitable copper metalization technology may be used for such fabrication. For example, MOTOROLA® copper technology (e.g., 0.18 μm MOTOROLA® copper process) may be used to fabricate the spirals. MOTOROLA® is a registered trademark of Motorola, Inc., a Delaware corporation, Schaumburg, Ill.

Some of the factors affecting filter performance include, but are not limited to:

1) Coupling: Since Q of the filter is directly related to the transformer coupling, the nature of coupling and physical parameters that contribute to coupling should be considered to maximize the magnetic coupling in the transformers;

2) Losses: As the transformer losses and filter losses are dependent on one another, transformer losses should be reduced. The transformer losses may include substrate losses due to dielectric loss tangent, inductive losses due to eddy currents, and/or conduction and diffusion losses; and 3) Circuit: The relationships between the intrinsic performance and structural design of the device and its performance in applications.

FIG. 7 is a photo image of an on-chip filter 250, which has the same topology as the band pass filter 220 of FIG. 4, except that the on-chip filter 250 includes two transformers arrayed in series. The on-chip filter 250 is designed to give minimum insertion loss at 1.55 GHz using Motorola 0.18-μm process.

The on-chip filter 250 has a twin spiral configuration, in which transformers 252 and 254 are coupled in series, to increase coupling and thus minimizing the insertion loss and yielding high Q. It can be seen that each of the transformers 252 and 254 has a configuration of the transformer 300 of FIG. 5. In other embodiments, the transformers 252 and 254 have the configuration of the transformer 310 of FIG. 6. The on-chip filter 250 also includes capacitors 256, 258, 260 and 262. The capacitors, for example, may be formed on-chip using two polysilicon layers or metal-on-polysilicon.

Figure 8:
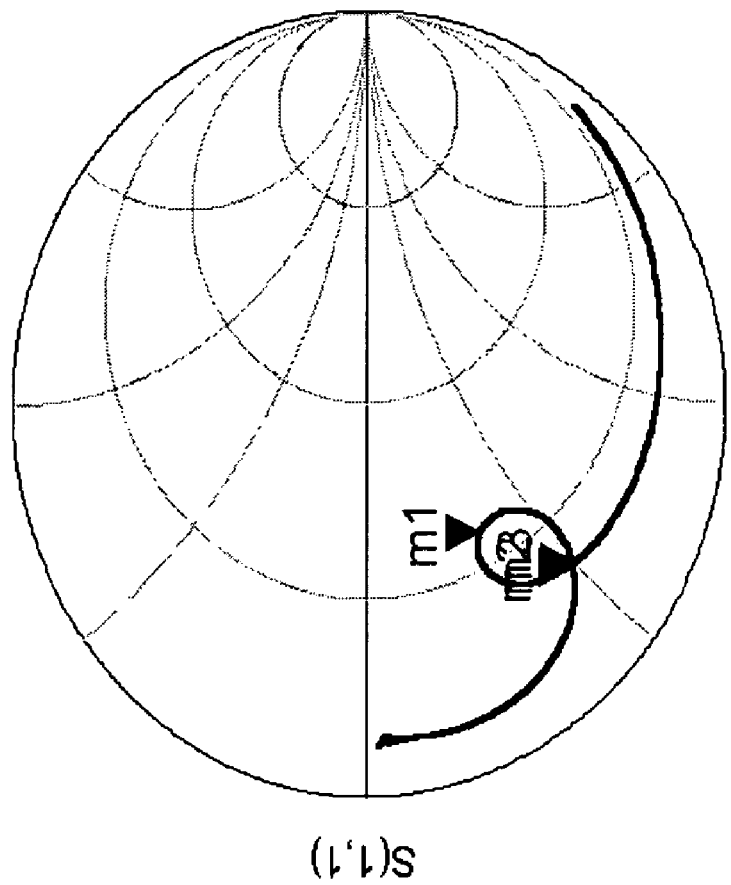
FIG. 8 is an S11 plot of an exemplary filter in polar form.
Figure 9:
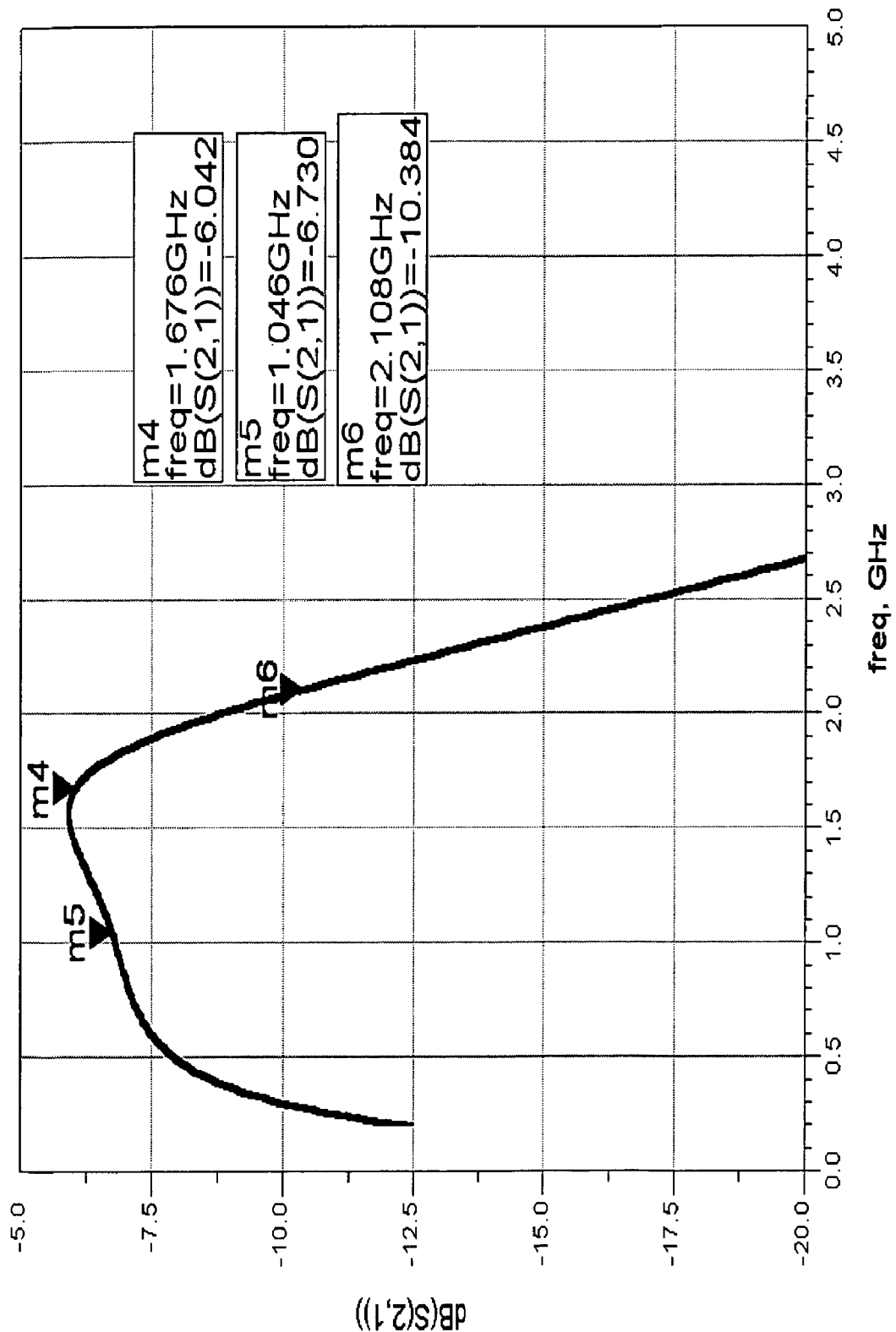
FIG. 9 is an S21 plot of the exemplary filter in magnitude form.

FIG. 8 is an S11 (return loss) plot of the on-chip filter 250 in polar form, and FIG. 9 is an S21 (frequency response) plot of the exemplary filter in magnitude form. The measurements in FIGS. 8 and 9 show a shift in the operating frequency.

Figure 10:
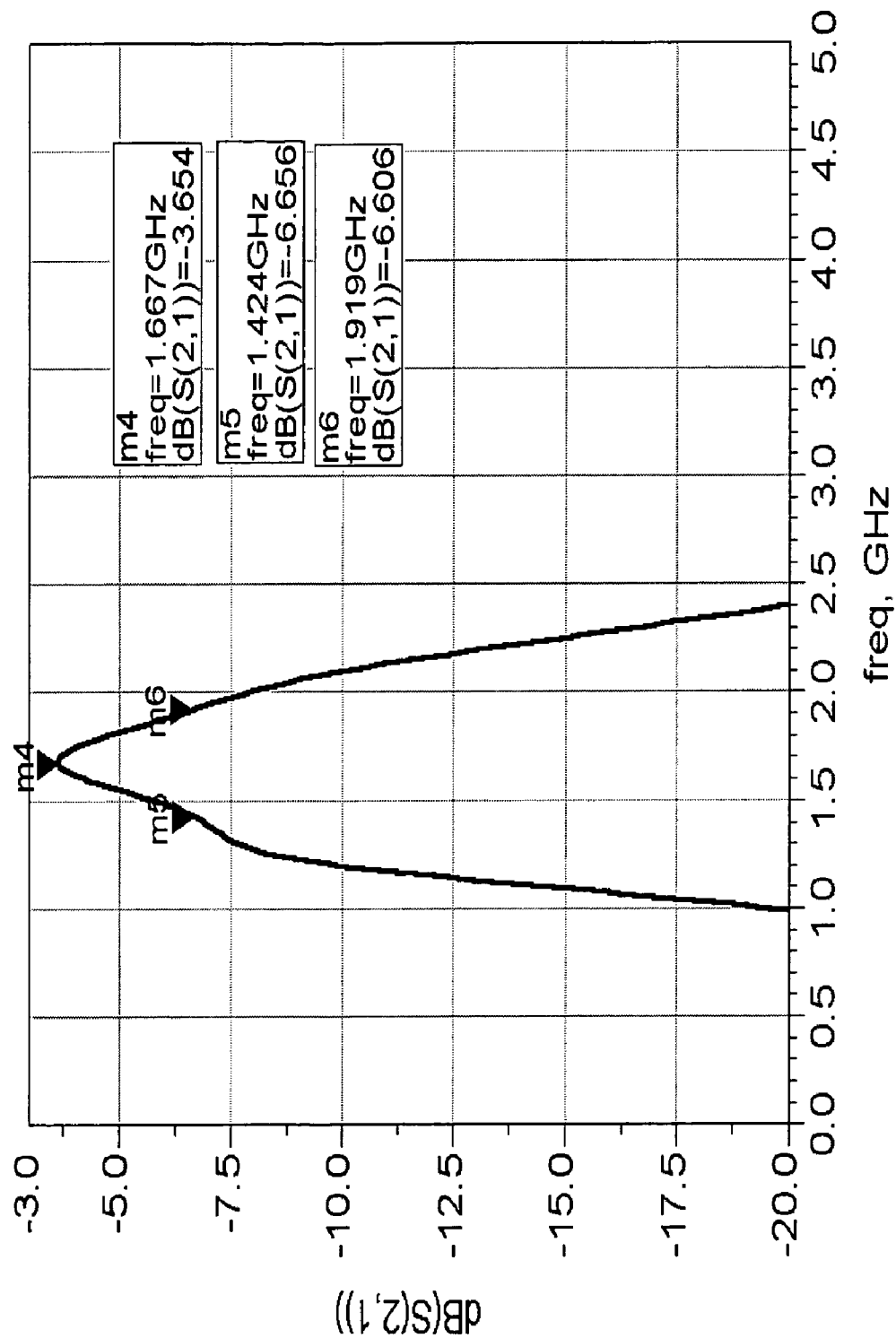
FIG. 10 is an S12 of the exemplary filter.

FIG. 10 is an S12 (frequency response) plot of the filter at (0.425–j0.337). The S12 response of the filter has been measured after matching using an external capacitor and a length L=0.253λ of a transmission line, which were off-chip. However, the capacitor and the transmission line may be integrated on-chip. The measured value of S12 without match was 0.54/38. The filter gives unloaded Q of about 10. It should be noted that bump conductors or wider conductor for the transformer can increase Q proportionally. It should also be noted that it is possible to obtain filter Q from the new filter that is higher than the transformer Q used to implement the filter. This is due to the distributed nature of input to output transformation, where the input signal does not have to go through the entire primary winding, and instead, may gradually couple to the output.

It will be appreciated by those of ordinary skill in the art that the invention can be embodied in other specific forms without departing from the spirit or essential character hereof. The present description is therefore considered in all respects to be illustrative and not restrictive. The scope of the invention is indicated by the appended claims, and all changes that come within the meaning and range of equivalents thereof are intended to be embraced therein.

The invention claimed is:

1. A band pass filter formed on an integrated circuit (IC) chip, said band pass filter comprising:

a transformer capable of receiving an input signal and providing high pass filtering, said transformer comprising at least a pair of metallic spirals formed on the IC chip; and a capacitor capable of receiving said input signal and providing low pass filtering in conjunction with an inductance of the transformer, wherein said band pass filter provides band pass filtering through cascading said high pass and low pass filtering.

2. The band pass filter of claim 1, further comprising a plurality of band pass filter stages, each band pass filter stage comprising a capacitor and a transformer comprising a pair of metallic spirals formed on the IC chip, wherein said band pass filter stages are cascaded to form the band pass filter.

3. The band pass filter of claim 1, wherein said metallic spirals comprise copper spirals.

4. The band pass filter of claim 1, wherein the transformer comprises a pair of transformers arrayed in series, wherein each transformer comprises a pair of metallic spirals.

5. The band pass filter of claim 1, wherein the metallic spirals are co-planer and have been inter-wound to form the transformer on the IC chip.

6. The band pass filter of claim 1, wherein the metallic spirals are stacked, one on top of the other, to form the transformer on the IC chip.

7. The band pass filter of claim 6, wherein the metallic spirals are separated by a dielectric material disposed therebetween.

8. The band pass filter of claim 7, wherein the dielectric material comprises silicon dioxide.

9. The band pass filter of claim 1, wherein communication circuitry is formed on the same IC chip as the transformer and the capacitor.

10. The band pass filter of claim 1, wherein a transformation ratio of the transformer is between approximately 1:1 and approximately 1:2.

11. The band pass filter of claim 1, Wherein the IC chip comprises a silicon substrate.

12. The band pass filter of claim 1, wherein the metallic spirals have a substantially rectangular or square overall shape.

13. A communication system-on-chip (SOC) comprising communication circuitry and a band pass filter formed on an integrated circuit (IC) chip, said band pass filter comprising: a transformer capable of receiving an input signal and providing high pass filtering, said transformer comprising at least a pair of metallic spirals formed on the IC chip; and a capacitor capable of receiving said input signal and providing low pass filtering in conjunction with an inductance of the transformer, wherein said band pass filter provides band pass filtering through cascading said high pass and low pass filtering.

14. The communication SOC of claim 13, wherein the band pass filter further comprises a plurality of band pass filter stages, each band pass filter stage comprising a capacitor and a transformer comprising a pair of metallic spirals formed on the IC chip, wherein said band pass filter stages are cascaded to form the band pass filter.

15. The communication SOC of claim 13, wherein said metallic spirals comprise copper spirals.

16. The communication Soc of claim 13, wherein the transformer comprises a pair of transformers arrayed in series, wherein each transformer comprises a pair of metallic spirals.

17. The communication SOC of claim 13, wherein the metallic spirals are co-planer and have been inter-wound to form the transformer on the IC chip.

18. The communication SOC of claim 13, wherein the metallic spirals are stacked, one on top of the other, to form the transformer on the IC chip.

19. The communication SOC of claim 18, wherein the metallic spirals are separated by a dielectric material disposed therebetween.

20. The communication SOC of claim 19, wherein the dielectric material comprises silicon dioxide.

21. The communication SOC of claim 13, wherein a transformation ratio of the transformer is between approximately 1:1 and approximately 1:2.

* * * * *